(12) United States Patent
Takahashi

(10) Patent No.: US 9,093,523 B2
(45) Date of Patent: Jul. 28, 2015

(54) SWITCHING ELEMENT AND A DIODE BEING CONNECTED TO A POWER SOURCE AND AN INDUCTIVE LOAD

(71) Applicant: Kabushiki Kaisha Toshiba, Minato-ku, Tokyo (JP)

(72) Inventor: Keita Takahashi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/203,204

(22) Filed: Mar. 10, 2014

(65) Prior Publication Data
US 2015/0076598 A1 Mar. 19, 2015

(30) Foreign Application Priority Data

Sep. 13, 2013 (JP) .................. 2013-191112

(51) Int. Cl.
| | |
|---|---|
| H01L 27/00 | (2006.01) |
| H01L 29/78 | (2006.01) |
| H01L 27/06 | (2006.01) |
| H01L 49/02 | (2006.01) |
| H01L 27/07 | (2006.01) |
| H01L 23/50 | (2006.01) |
| H01L 23/64 | (2006.01) |

(52) U.S. Cl.
CPC ............ *H01L 29/7818* (2013.01); *H01L 23/50* (2013.01); *H01L 23/645* (2013.01); *H01L 27/0629* (2013.01); *H01L 27/0727* (2013.01); *H01L 28/10* (2013.01)

(58) Field of Classification Search
CPC . H01L 27/0629; H01L 27/0727; H01L 23/50; H01L 23/645
See application file for complete search history.

(56) References Cited

U.S. PATENT DOCUMENTS

| | | | |
|---|---|---|---|
| 5,491,358 A * | 2/1996 | Miyata ......................... | 257/546 |
| 6,593,627 B2 * | 7/2003 | Egashira ...................... | 257/350 |
| 2006/0186483 A1* | 8/2006 | Cho et al. ..................... | 257/390 |
| 2007/0176254 A1* | 8/2007 | Liu et al. ...................... | 257/511 |
| 2009/0057770 A1* | 3/2009 | Pang ............................ | 257/369 |
| 2009/0096033 A1* | 4/2009 | Pendharkar et al. ......... | 257/370 |
| 2010/0051946 A1* | 3/2010 | Jun ............................... | 257/49 |
| 2011/0187475 A1* | 8/2011 | Kim et al. .................... | 333/103 |
| 2012/0211842 A1* | 8/2012 | Reinprecht et al. .......... | 257/371 |

FOREIGN PATENT DOCUMENTS

| | | |
|---|---|---|
| JP | 5-77631 U | 10/1993 |
| JP | H05-77631 U | 10/1993 |
| JP | 2000-105613 A | 4/2000 |
| JP | 2000-333468 A | 11/2000 |

* cited by examiner

Primary Examiner — Ngan Ngo
(74) Attorney, Agent, or Firm — White & Case LLP

(57) ABSTRACT

According to one embodiment, a semiconductor device includes a switching element and a diode provided on a substrate. The switching element includes a first semiconductor layer, a drain region, a source region, a channel region, a gate insulating film, and a gate electrode. The diode includes a second semiconductor layer, an anode region, and a cathode region.

19 Claims, 8 Drawing Sheets

SWITCHING ELEMENT AND A DIODE BEING CONNECTED TO A POWER SOURCE AND AN INDUCTIVE LOAD

CROSS-REFERENCE TO RELATED APPLICATION

This application is based upon and claims the benefit of priority from Japanese Patent Application No. 2013-191112, filed on Sep. 13, 2013; the entire contents of which are incorporated herein by reference.

FIELD

Embodiments described herein relate generally to a semiconductor device.

BACKGROUND

In a switching device connected to an inductive load such as a coil, when the gate is OFF, a current flows through the body diode (parasitic diode) of the switching device due to energy accumulated in the inductive load. This may operate a thyristor that is parasitic in the switching device, a substrate on which the switching device is formed, and another device formed on the same substrate; and may cause breaking of the other device.

DETAILED DESCRIPTION

Figure 1:
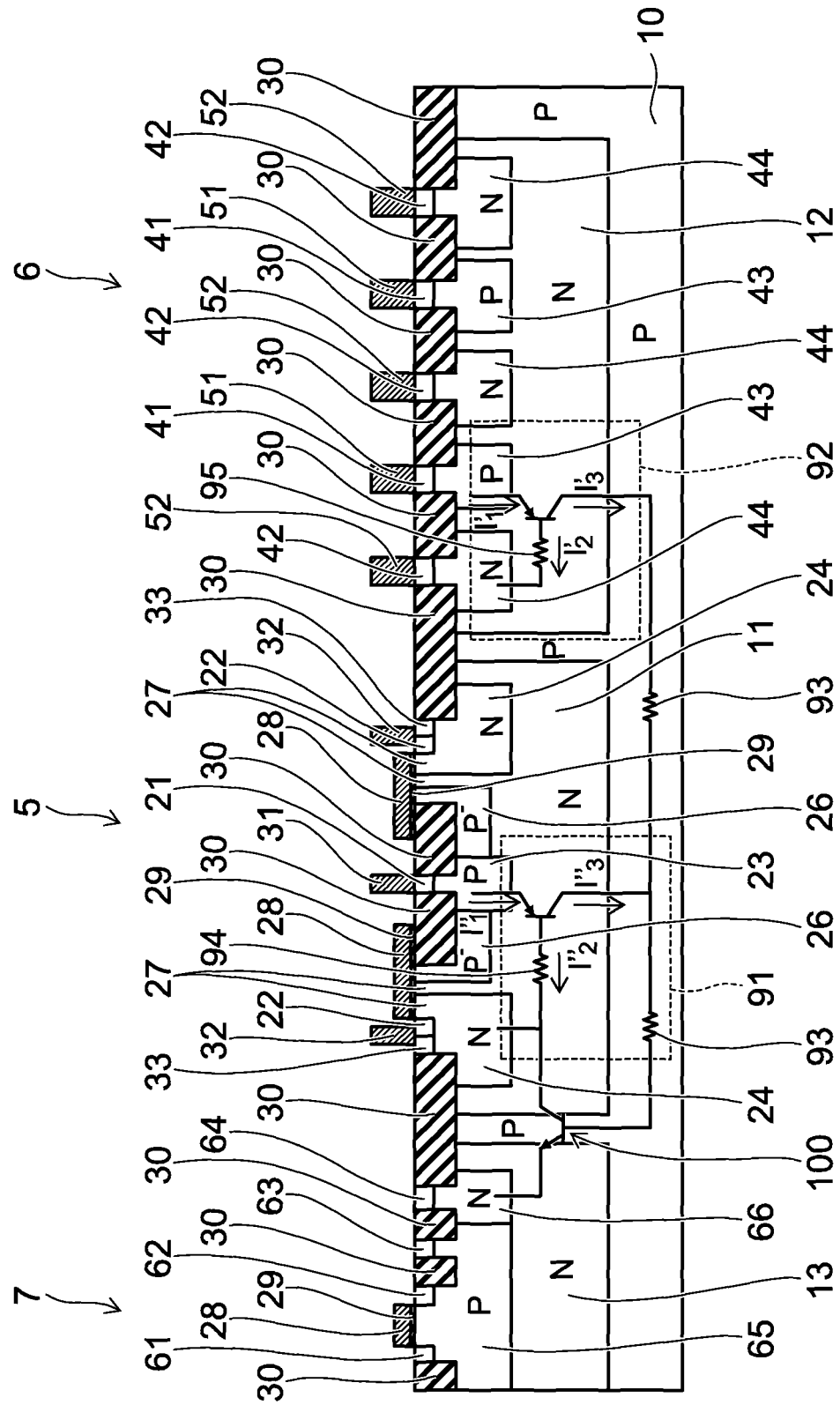
FIG. 1 is a schematic cross-sectional view of a semiconductor device of an embodiment.

According to one embodiment, a semiconductor device includes a switching element and a diode provided on a substrate. The switching element includes a first semiconductor layer, a drain region, a source region, a channel region, a gate insulating film, and a gate electrode. The first semiconductor layer is provided in the substrate and electrically isolated from the substrate. The drain region is provided on a surface of the first semiconductor layer. The source region is provided apart from the drain region on the surface of the first semiconductor layer and has a same conductivity type as the drain region. The channel region is provided between the drain region and the source region on the surface of the first semiconductor layer and has a conductivity type opposite to the conductivity type of the drain region and the source region. The gate insulating film is provided on the channel region. The gate electrode is provided on the gate insulating film. The diode includes a second semiconductor layer, an anode region, and a cathode region. The second semiconductor layer is provided in the substrate and electrically isolated from the substrate. The anode region is provided on a surface of the second semiconductor layer. The cathode region is provided apart from the anode region on the surface of the second semiconductor layer.

Hereinbelow, embodiments are described with reference to the drawings. In the drawings, identical components are marked with the same reference numerals. Although in the following embodiments a description is given using the p-type as the first conductivity type and the n-type as the second conductivity type, the embodiments can be carried out also by using the n-type as the first conductivity type and the p-type as the second conductivity type.

FIG. 1 is a schematic cross-sectional view of a semiconductor device of an embodiment.

The semiconductor device of the embodiment has a structure in which a switching element 5, a diode 6, and a logic element 7 are mixedly mounted on the same substrate 10.

The substrate 10 is a P-type semiconductor substrate, such as a P-type silicon substrate. The semiconductor layer (region) described below is a silicon layer (region). Alternatively, the substrate 10 and the semiconductor layer (region) are not limited to silicon, and may be silicon carbide, gallium nitride, or the like, for example.

An insulating film 30 of an STI (shallow trench isolation) structure is provided between elements that are intended to be separated on the surface of the semiconductor layer, for example.

An analog integrated circuit including the logic element 7 is formed in a center-side region of the semiconductor device in a chip form, for example. The switching element 5 and the diode 6 are formed in a region around the chip, for example. The switching element 5 is formed in a region between the logic element 7 and the diode 6, for example.

The logic element 7 and the switching element 5 are dielectrically isolated by the insulating film 30 formed between them. The switching element 5 and the diode 6 are dielectrically isolated by the insulating film 30 formed between them.

The switching element 5 is a P-channel DMOS (double diffused metal oxide semiconductor field effect transistor), for example. In the DMOS, the channel is formed by double diffusion, and the difference in the lateral diffusion of the diffusion region is used as the effective channel length.

The switching element 5 includes an N-type semiconductor layer 11 (as a first semiconductor layer) formed in the substrate 10. The N-type semiconductor layer 11 and the P-type substrate 10 are joined together by p-n junction, and the N-type semiconductor layer 11 is electrically isolated from the substrate 10. The substrate 10 is grounded, and the N-type semiconductor layer 11 is connected to the source potential of the switching element 5 via an N-type semiconductor region 24 and an $N^+$-type semiconductor region 33.

A pair of $P^-$-type semiconductor regions 26 are formed on the surface of the N-type semiconductor layer 11, and a P-type semiconductor region 23 is formed between the pair of $P^-$-type semiconductor regions 26. The P-type impurity concentration of the P-type semiconductor region 23 is higher than the P-type impurity concentration of the $P^-$-type semiconductor region 26.

A $P^+$-type drain region 21 is formed on the surface of the P-type semiconductor region 23. The P-type impurity concentration of the $P^+$-type drain region 21 is higher than the P-type impurity concentration of the P-type semiconductor region 23.

Both side surfaces of the P+-type drain region 21 are in contact with the insulating film 30 formed on the surface of the P−-type semiconductor region 26.

A pair of N-type semiconductor regions 24 are formed on the surface of the N-type semiconductor layer 11 apart from each of the pair of P−-type semiconductor regions 26.

A P+-type source region 22 is formed on the surface of each N-type semiconductor region 24.

The N+-type semiconductor region 33 is formed adjacent to the P+-type source region 22 on the surface of each N-type semiconductor region 24. The N-type impurity concentration of the N+-type semiconductor region 33 is higher than the N-type impurity concentration of the N-type semiconductor region 24.

One side surface of the N+-type semiconductor region 33 is in contact with the P+-type source region 22, and the other side surface is in contact with the insulating film 30.

A side surface of the P+-type source region 22 on the P+-type drain region 21 side is located in the N-type semiconductor region 24. The N-type semiconductor layer 11 is formed between the N-type semiconductor region 24 and the P−-type semiconductor region 26.

The surface area of the N-type semiconductor region 24 and the surface area of the N-type semiconductor layer 11 formed between the P+-type source region 22 and the P−-type semiconductor region 26 function as a channel region 27.

A gate insulating film 29 is provided on the channel region 27 and on the surface of the p−-type semiconductor region 26 adjacent to the channel region 27. A gate electrode 28 is provided on the gate insulating film 29.

A drain electrode 31 is provided on the P+-type drain region 21. The P+-type drain region 21 is in ohmic contact with and electrically connected to the drain electrode 31 by a desired method of being in direct contact, being in contact via a metal silicide layer, or the like.

A source electrode 32 is provided on the P+-type source region 22. The P+-type source region 22 is in ohmic contact with and electrically connected to the source electrode 32 by a desired method of being in direct contact, being in contact via a metal silicide layer, or the like.

The source electrode 32 is provided also on the N+-type semiconductor region 33, and is in contact with the N+-type semiconductor region 33.

Each semiconductor region and the gate electrode 28 of the switching element 5 are formed in a striped planar pattern, for example.

In the switching element 5 described above, when a desired gate voltage is applied to the gate electrode 28, an inversion layer (P channel) is formed in the channel region 27, and a current flows between the source electrode 32 and the drain electrode 31 via the P+-type source region 22, the channel region 27, the P−-type semiconductor region 26, the P-type semiconductor region 23, and the P+-type drain region 21. In the P−-type semiconductor region 26 and the P-type semiconductor region 23, a current flows to go round in a region under the insulating film 30.

The insulating film 30 formed on the drain side enhances the breakdown voltage of the switching element 5. The P−-type semiconductor region 26 with a lower P-type impurity concentration than the P+-type drain region 21 is depleted during gate OFF, and improves the breakdown voltage.

The P-type semiconductor region 23 with a P-type impurity concentration between the P-type impurity concentration of the P−-type semiconductor region 26 and the P-type impurity concentration of the P+-type drain region 21 is provided between the P−-type semiconductor region 26 and the P+-type drain region 21; thereby, the decrease in breakdown voltage due to a sharp change in impurity concentration from the P−-type semiconductor region 26 to the P+-type drain region 21 can be suppressed.

Next, the diode 6 is described.

The diode 6 includes an N-type semiconductor layer 12 formed in the substrate 10. The N-type semiconductor layer 12 and the P-type substrate 10 are joined together by p-n junction, and the N-type semiconductor layer 12 is electrically isolated from the substrate 10. The substrate 10 is grounded, and the N-type semiconductor layer 12 is connected to a cathode electrode 52 of the diode 6 via an N-type semiconductor region 44 and an N+-type cathode region 42.

A plurality of P-type semiconductor regions 43 and a plurality of N-type semiconductor regions 44 are formed on the surface of the N-type semiconductor layer 12. The P-type semiconductor region 43 and the N-type semiconductor region 44 are alternately arranged in a striped planar pattern, for example. The P-type semiconductor region 43 and the N-type semiconductor region 44 are apart.

A P+-type anode region 41 is formed on the surface of each P-type semiconductor region 43. The P-type impurity concentration of the P+-type anode region 41 is higher than the P-type impurity concentration of the P-type semiconductor region 43.

The N+-type cathode region 42 is formed on the surface of each N-type semiconductor region 44. The N-type impurity concentration of the N+-type cathode region 42 is higher than the N-type impurity concentration of the N-type semiconductor region 44.

The insulating film 30 is provided between the P+-type anode region 41 and the N+-type cathode region 42, and the P+-type anode region 41 and the N+-type cathode region 42 are separated by the insulating film 30.

An anode electrode 51 is provided on the P+-type anode region 41. The P+-type anode region 41 is in ohmic contact with and electrically connected to the anode electrode 51 by a desired method of being in direct contact, being in contact via a metal silicide layer, or the like.

The cathode electrode 52 is provided on the N+-type cathode region 42. The N+-type cathode region 42 is in ohmic contact with and electrically connected to the cathode electrode 52 by a desired method of being in direct contact, being in contact via a metal silicide layer, or the like.

The logic element 7 has a structure different from the switching element 5 with a DMOS structure and the diode 6, and has a CMOS structure, for example. FIG. 1 illustrates part of the logic element 7 (for example, an N-channel MOSFET).

The logic element 7 includes an N-type semiconductor layer 13 formed in the substrate 10, for example. The N-type semiconductor layer 13 and the P-type substrate 10 are joined together by p-n junction, and the N-type semiconductor layer 13 is electrically isolated from the substrate 10.

A P-type semiconductor region 65 is formed on the surface of the N-type semiconductor layer 13. An N+-type semiconductor region 61 and an N+-type semiconductor region 62 are formed on the surface of the P-type semiconductor region 65. One of the N+-type semiconductor region 61 and the N+-type semiconductor region 62 functions as a drain region, and the other functions as a source region.

A gate electrode 28 is provided on the channel region (the surface area of the P-type semiconductor region 65) between the N+-type semiconductor layer 61 and the N+-type semiconductor region 62 via a gate insulating film 29.

An N-type semiconductor region 66 is formed adjacent to the P-type semiconductor region 65 on the surface of the N-type semiconductor layer 13. An N$^+$-type semiconductor region 64 is formed on the surface of the N-type semiconductor region 66.

The N-type impurity concentration of the N$^+$-type semiconductor region 64 is higher than the N-type impurity concentration of the N-type semiconductor region 66.

A P$^+$-type semiconductor region 63 is formed on the surface of the P-type semiconductor region 65. The insulating film 30 is formed between the P$^+$-type semiconductor region 63 and the N$^+$-type semiconductor region 62. The insulating film 30 is formed between the P$^+$-type semiconductor region 63 and the N$^+$-type semiconductor region 64.

The switching element 5, the diode 6, and the logic element 7 are formed on the surfaces of the N-type semiconductor layer 11, the N-type semiconductor layer 12, and the N-type semiconductor layer 13, respectively, which are electrically isolated from the substrate 10. That is, none of the switching element 5, the diode 6, and the logic element 7 are electrically connected via the substrate 10.

While the substrate 10 is grounded, the electric potentials of the N-type semiconductor layer 11 and the N-type semiconductor layer 12 are high potentials. Therefore, it is less likely that a current will flow from the switching element 5, the diode 6, and the logic element 7 to the substrate 10.

The switching element 5 is used for an H bridge circuit, an inverter circuit, a DC-DC converter circuit, and the like that output a large current, for example.

Figure 2:
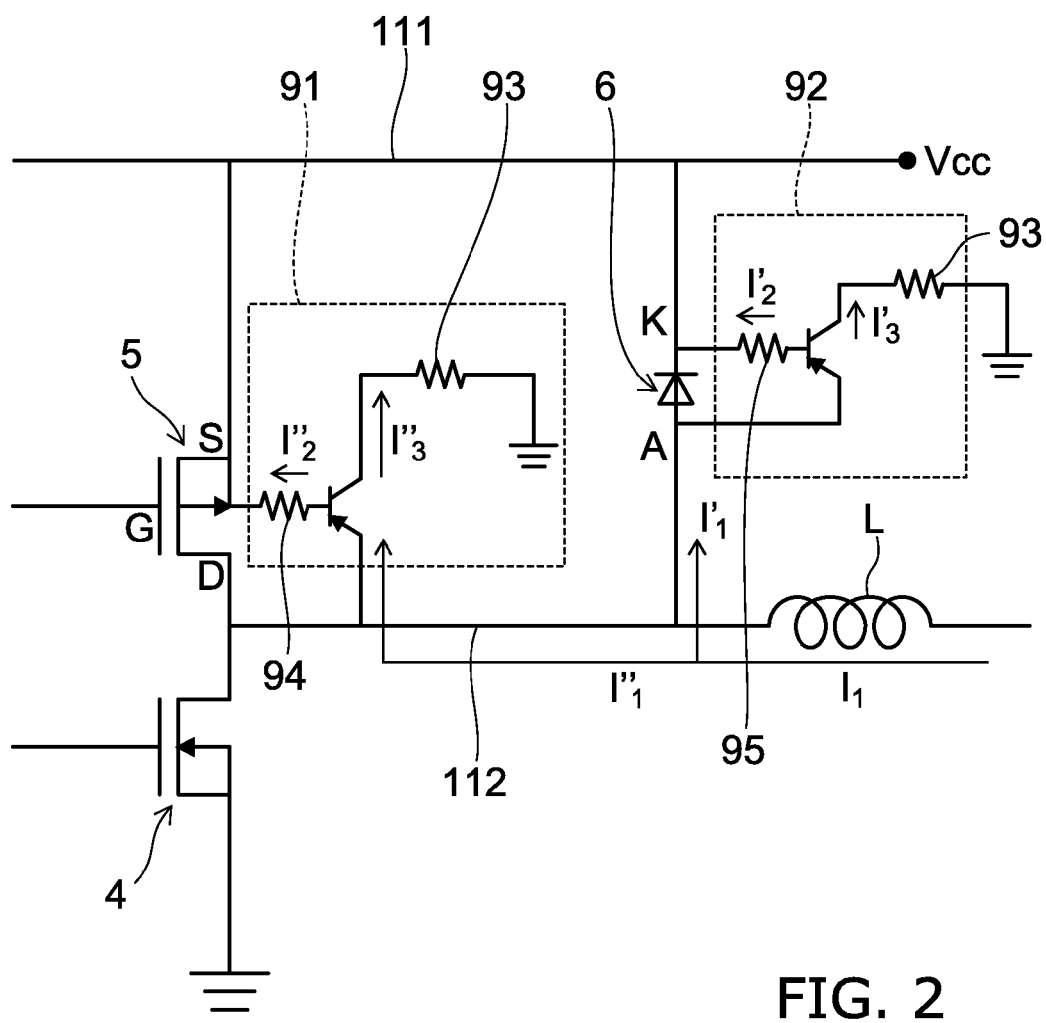
FIG. 2 is a circuit diagram of the semiconductor device of the embodiment.

FIG. 2 is a circuit diagram of a circuit including the semiconductor device of the embodiment.

The switching element (high-side switching element) 5 described above and a low-side switching element 4 are connected in series between a power supply line (input line) 111 that is connected to a power source and is supplied with a power supply voltage (input voltage) Vcc and a ground terminal.

The source terminal (the source electrode 32) of the switching element 5 is connected to the power supply line 111, and the drain terminal (the drain electrode 31) is connected to an output line 112.

The low-side switching element 4 is an N-channel MOSFET, for example. The drain terminal of the low-side switching element 4 is connected to the drain terminal of the switching element 5 and the output line 112. The source terminal of the low-side switching element 4 is connected to the ground terminal.

The diode 6 described above is connected between the power supply line 111 and the output line 112. The anode terminal (the anode electrode 51) of the diode 6 is connected to the output line 112, and the cathode terminal (the cathode electrode 52) is connected to the power supply line 111.

A coil L is connected as an inductive load to the output line 112. Thus, the switching element 5 and the diode 6 are connected in parallel between the power source and the coil L. That is, the switching element 5 and the diode 6 include a terminal connected to the power source and a terminal connected to the coil L.

The high-side switching element 5, the low-side switching element 4, and a driver circuit or a control circuit that drives them are integrated in one chip.

In a DC-DC converter (buck converter), an average output voltage lower than the input voltage Vcc is outputted by switching the high-side switching element 5 and the low-side switching element 4 to ON and OFF alternately, for example.

When the low-side switching element 4 is ON and the high-side switching element 5 is OFF, a current is outputted to the low-side switching element 4 and the ground terminal from an output terminal via the coil L. At this time, the current flows through the coil L, and energy is accumulated in the coil L.

Next, when the high-side switching element 5 and the low-side switching element 4 are set to ON simultaneously, a through current flows from the power supply line 111 to the ground terminal via the switching elements 5 and 4. To avoid this, in setting the duty of ON/OFF of the switching elements 5 and 4, a dead time is set that is a period when both of the switching elements 5 and 4 are OFF.

In the dead time period, the gate of the switching element 5 is OFF, but the coil L continues to pass a current due to the accumulated energy; therefore, a regenerative current flows through the body diode of the switching element 5 (the p-n junction between the P-type semiconductor region 23 and the N-type semiconductor region 11 in FIG. 1). At this time, a parasitic PNP transistor 91 may operate.

The switching element 5 is made to have a high breakdown voltage by the depletion layer spreading from the p-n junction between the N-type semiconductor layer 11 and the P-type substrate 10. In this regard, the N-type impurity concentration in the N-type semiconductor layer 11 and the P-type impurity concentration in the P-type substrate 10 are set at a low level.

Since the N-type impurity concentration in the N-type semiconductor layer 11 is low, the recombination current of the base of the parasitic PNP transistor 91 is reduced, and the base resistance 94 is increased; thus, a current is more likely to flow to the substrate 10.

Since also the parasitic resistance 93 of the substrate 10 is high, the electric potential of the substrate 10 is likely to increase, and the base potential of an NPN transistor 100 parasitic on the switching element 5, the substrate 10, and another element 7 (FIG. 1) increases; thus, the parasitic NPN transistor 100 will operate.

If the parasitic NPN transistor 100 operates, the base current of the parasitic PNP transistor 91 is supplied continuously; consequently, the parasitic PNP transistor 91 will not return to OFF but continue to operate, and accordingly the parasitic NPN transistor 100 will not return to OFF either. That is, it is feared that latch-up will be caused by the operation of the parasitic thyristor and a large current will flow into the logic element 7 to break the logic element 7.

However, in the embodiment, the diode 6 is connected in parallel to the switching element 5 between the power source and the coil L.

Therefore, in the dead time period, the current $I_1$ flowing from the coil L is dispersed into a current $I''_1$ flowing to the drain side of the switching element 5 and a current $I'_1$ flowing to the anode side of the diode 6, and the current $I''_3$ flowing to the substrate 10 via the parasitic PNP transistor 91 of the switching element 5 can be reduced.

Although a parasitic PNP transistor 92 is produced also in the diode 6 similarly to the switching element 5, the current $I'_3$ flowing to the substrate 10 can be suppressed by reducing the base resistance 95 of the parasitic PNP transistor 92.

That is, the parasitic resistance of the diode 6 is lower than the parasitic resistance of the switching element 5. Thus, the current $I_1$ flowing from the coil L is more likely to flow from the anode to the cathode of the diode 6, as currents $I'_1$ and $I'_2$, and the current $I'_3$ flowing to the substrate 10 can be suppressed.

Since the currents $I''_3$ and $I'_3$ flowing to the substrate 10 are suppressed, the potential increase in the high resistive substrate 10 is suppressed, and element breaking due to latch-up caused by parasitic thyristor operation can be prevented.

In the embodiment, in order to make the parasitic resistance of the diode 6 lower than the parasitic resistance of the switching element 5, the N-type impurity concentration in the N-type semiconductor layer 12 is set higher than the N-type impurity concentration in the N-type semiconductor layer 11, for example.

Figure 3:
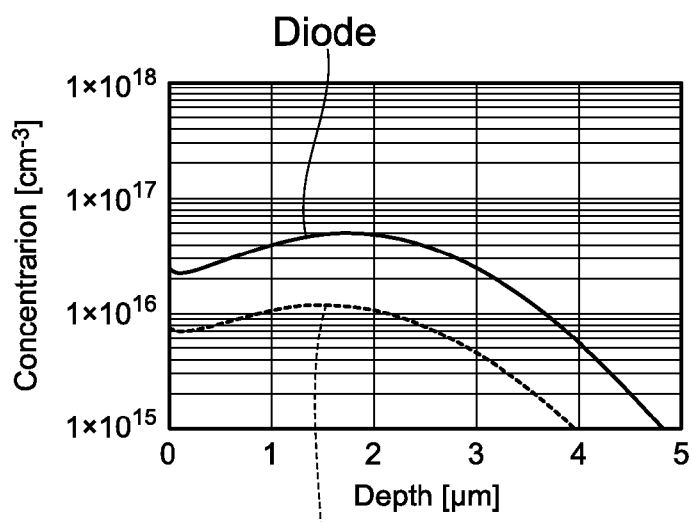
FIG. 3 is a chart showing an example of an impurity concentration in the semiconductor device of the embodiment.

FIG. 3 shows an example of the N-type impurity concentration in the N-type semiconductor layer 12 of the diode 6 (solid line) and the N-type impurity concentration in the N-type semiconductor layer 11 of the switching element 5 (broken line). The depth (μm) on the horizontal axis represents the depth from the surface of each of the N-type semiconductor layer 12 and the N-type semiconductor layer 11.

When the peak concentration of the N-type semiconductor layer 12 of the diode 6 is set to approximately $5 \times 10^{16}$ (cm$^{-3}$) and the peak concentration of the N-type semiconductor layer 11 of the switching element 5 is set to approximately $1.3 \times 10^{16}$ (cm$^{-3}$), the regenerative current flowing through the N-type semiconductor layer 12 of the diode 6 with a smaller parasitic resistance can be made larger than the regenerative current flowing through the N-type semiconductor layer 11 of the body diode of the switching element 5 with a larger parasitic resistance, for example.

The range of the N-type impurity concentration of the N-type semiconductor layer 12 and the N-type semiconductor layer 11 is set to $1 \times 10^{16}$ (cm$^{-3}$) to $1 \times 10^{18}$ (cm$^{-3}$), depending on the breakdown voltage required.

In the embodiment shown in FIG. 1, the N-type semiconductor layer 11 of the switching element 5 and the N-type semiconductor layer 12 of the diode 6 are formed separately in the P-type substrate 10. That is, between the N-type semiconductor layer 11 and the N-type semiconductor layer 12, a P-type semiconductor region of a conductivity type opposite to those of them is formed.

Therefore, carrier movement between the N-type semiconductor layer 11 and the N-type semiconductor layer 12 is suppressed, and malfunction of each of the switching element 5 and the diode 6 can be suppressed.

In order to make the parasitic resistance of the diode 6 lower than the parasitic resistance of the switching element 5, the distance between the anode region 41 and the cathode region 42 in the diode 6 is set shorter than the distance between the drain region 21 and the source region 22 in the switching element 5, for example. The distance herein refers to the straight-line distance connecting both regions by the shortest distance.

In order to make the parasitic resistance of the diode 6 lower than the parasitic resistance of the switching element 5, the interconnection resistance of the diode 6 may be set lower than the interconnection resistance of the switching element 5, for example.

Figure 4:
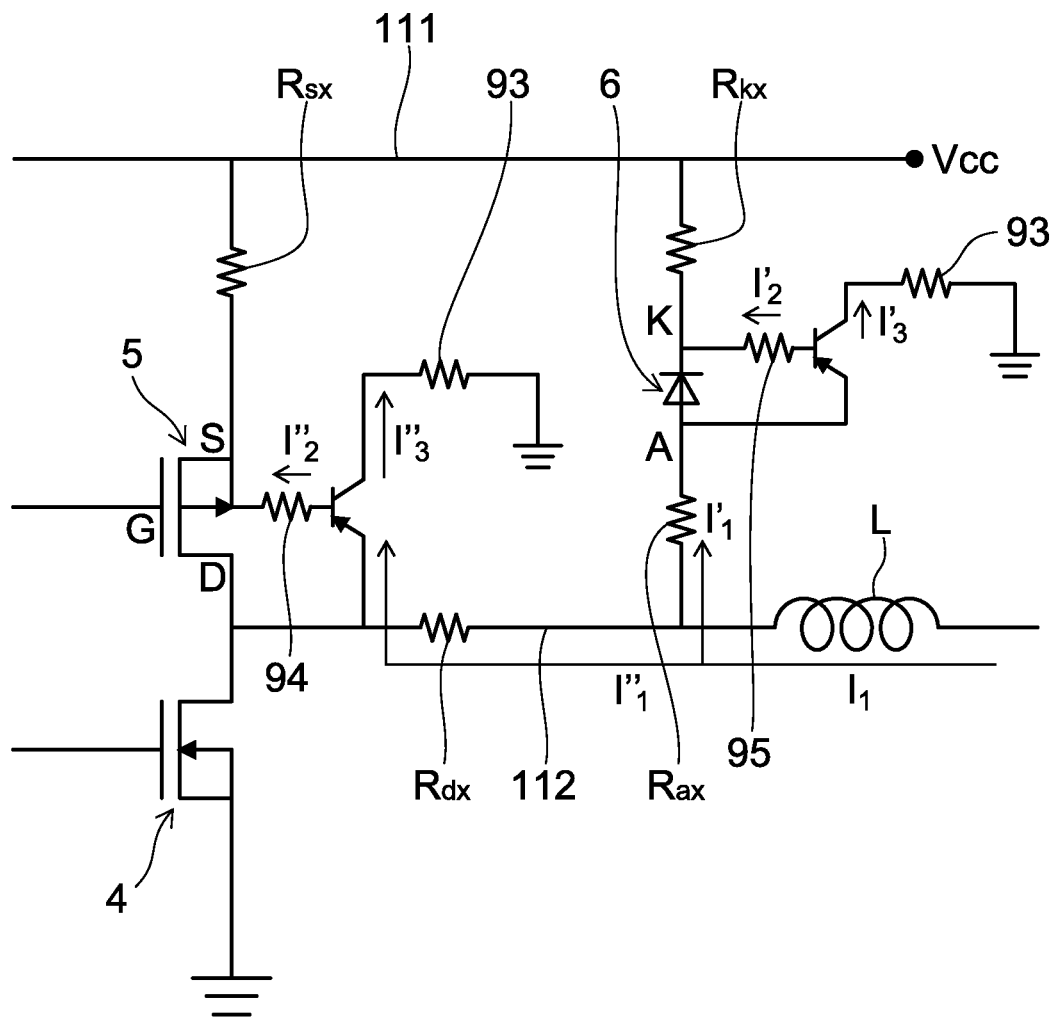
FIG. 4 is a circuit diagram of the semiconductor device of the embodiment.

The interconnection resistance of the diode 6 is the sum of the anode interconnection resistance Rax and the cathode interconnection resistance Rkx shown in FIG. 4. The anode interconnection resistance Rax expresses the resistance of the interconnection connecting the anode region 41 and the output line 112 (including the resistance of the anode electrode 51). The cathode interconnection resistance Rkx expresses the resistance of the interconnection connecting the cathode region 42 and the power supply line 111 (including the resistance of the cathode electrode 52).

The interconnection resistance of the switching element 5 is the sum of the drain interconnection resistance Rdx and the source interconnection resistance Rsx shown in FIG. 4. The drain interconnection resistance Rdx expresses the resistance of the interconnection connecting the drain region 21 and the output line 112 (including the resistance of the drain electrode 31). The source interconnection resistance Rsx expresses the resistance of the interconnection connecting the source region 22 and the power supply line 111 (including the resistance of the source electrode 32).

When the interconnection resistance of the switching element 5 (Rsx+Rdx) is set to 10 mΩ and the interconnection resistance of the diode 6 (Rax+Rkx) is set to 5 mΩ, the regenerative current $I_1$ from the coil L is more likely to flow to the diode 6 than to the switching element 5, for example.

The width of the interconnection of the diode 6 (including the anode electrode 51 and the cathode electrode 52) may be set larger than the width of the interconnection of the switching element 5 (including the drain electrode 31 and the source electrode 32); thereby, the interconnection resistance of the diode 6 can be made lower than the interconnection resistance of the switching element 5, for example.

The number of vias where electrodes are in contact with the anode region 41 and the cathode region 42 in the diode 6 may be set larger than the number of vias where electrodes are in contact with the drain region 21 and the source region 22 in the switching element 5; thereby, the interconnection resistance of the diode 6 can be made lower than the interconnection resistance of the switching element 5.

Figure 5:
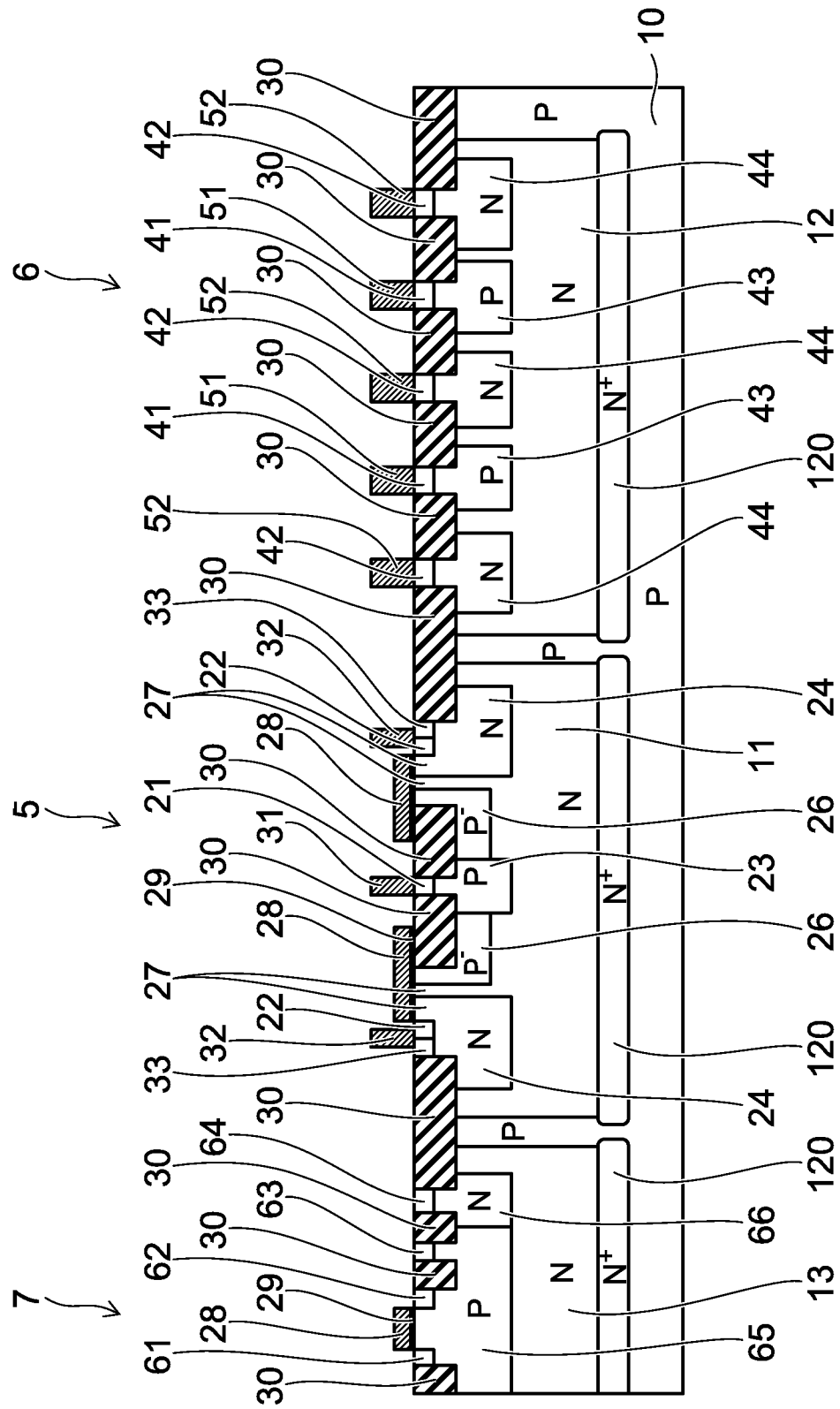
FIG. 5 is a schematic cross-sectional view of a semiconductor device of another embodiment.

FIG. 5 is a schematic cross-sectional view of a semiconductor device of another embodiment.

In the semiconductor device shown in FIG. 5, an N$^+$-type buried layer 120 is provided between the N-type semiconductor layer 11 and the substrate 10 in the switching element 5. In addition, the N$^+$-type buried layer 120 is provided between the N-type semiconductor layer 12 and the substrate 10 in the diode 6. In addition, the N$^+$-type buried layer 120 is provided between the N-type semiconductor layer 13 and the substrate 10 in the logic element 7.

The N-type impurity concentration of the N$^+$-type buried layer 120 is higher than the N-type impurity concentration of the N-type semiconductor layer 11, the N-type impurity concentration of the N-type semiconductor layer 12, and the N-type impurity concentration of the N-type semiconductor layer 13.

The power supply potential Vcc is given to the N$^+$-type buried layer 120. By the N$^+$-type buried layer 120, each of the switching element 5, the diode 6, and the logic element 7 is isolated from the substrate potential with reliability.

Figure 6:
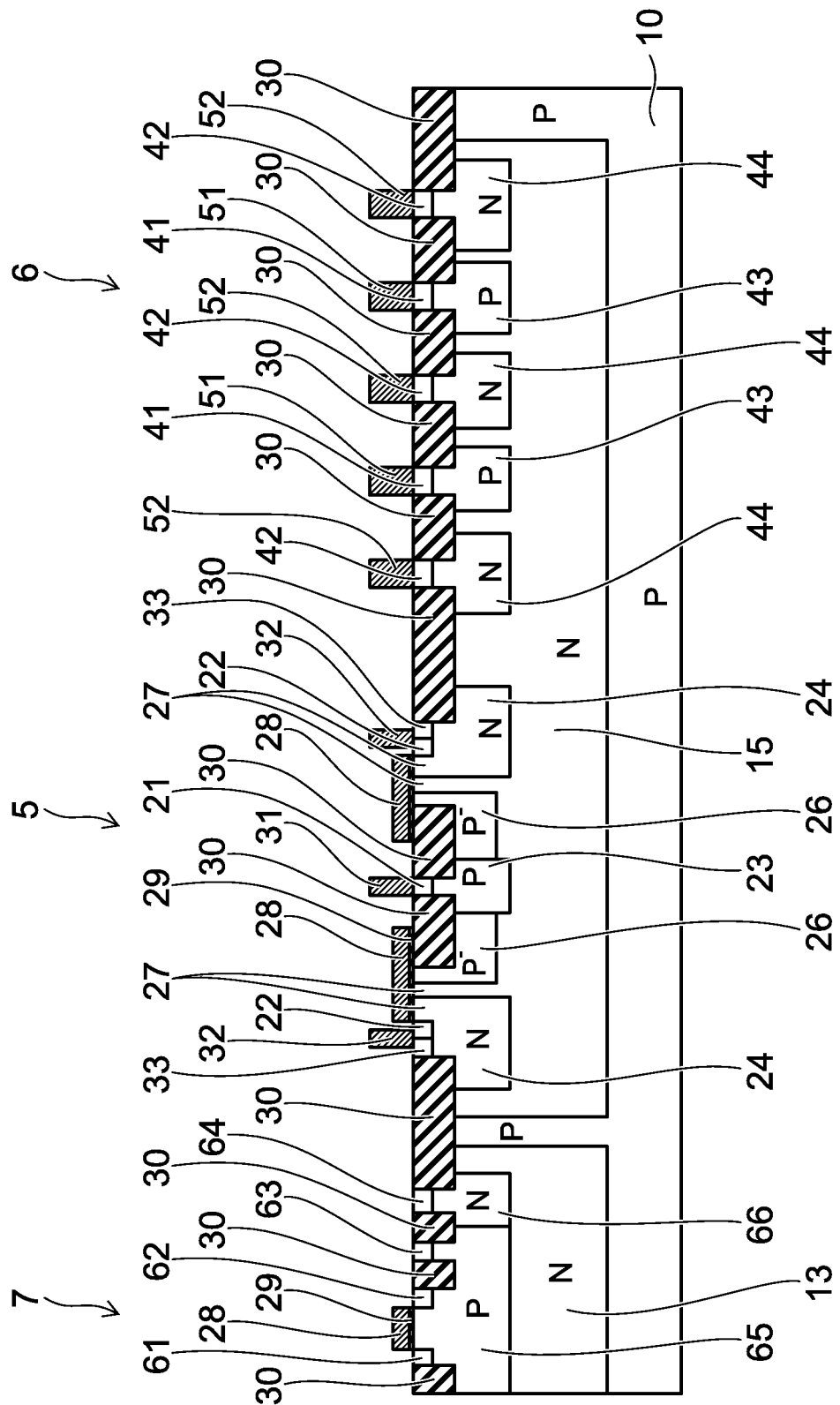
FIG. 6 is a schematic cross-sectional view of a semiconductor device of another embodiment.

FIG. 6 is a schematic cross-sectional view of a semiconductor device of still another embodiment.

In the semiconductor device shown in FIG. 6, the switching element 5 and the diode 6 are formed on the surface of the same N-type semiconductor layer 15 that is not separated but continuous between these elements. Also in this case, the switching element 5 and the diode 6 are electrically isolated from the P-type substrate 10 by the N-type semiconductor layer 15.

Figure 7:
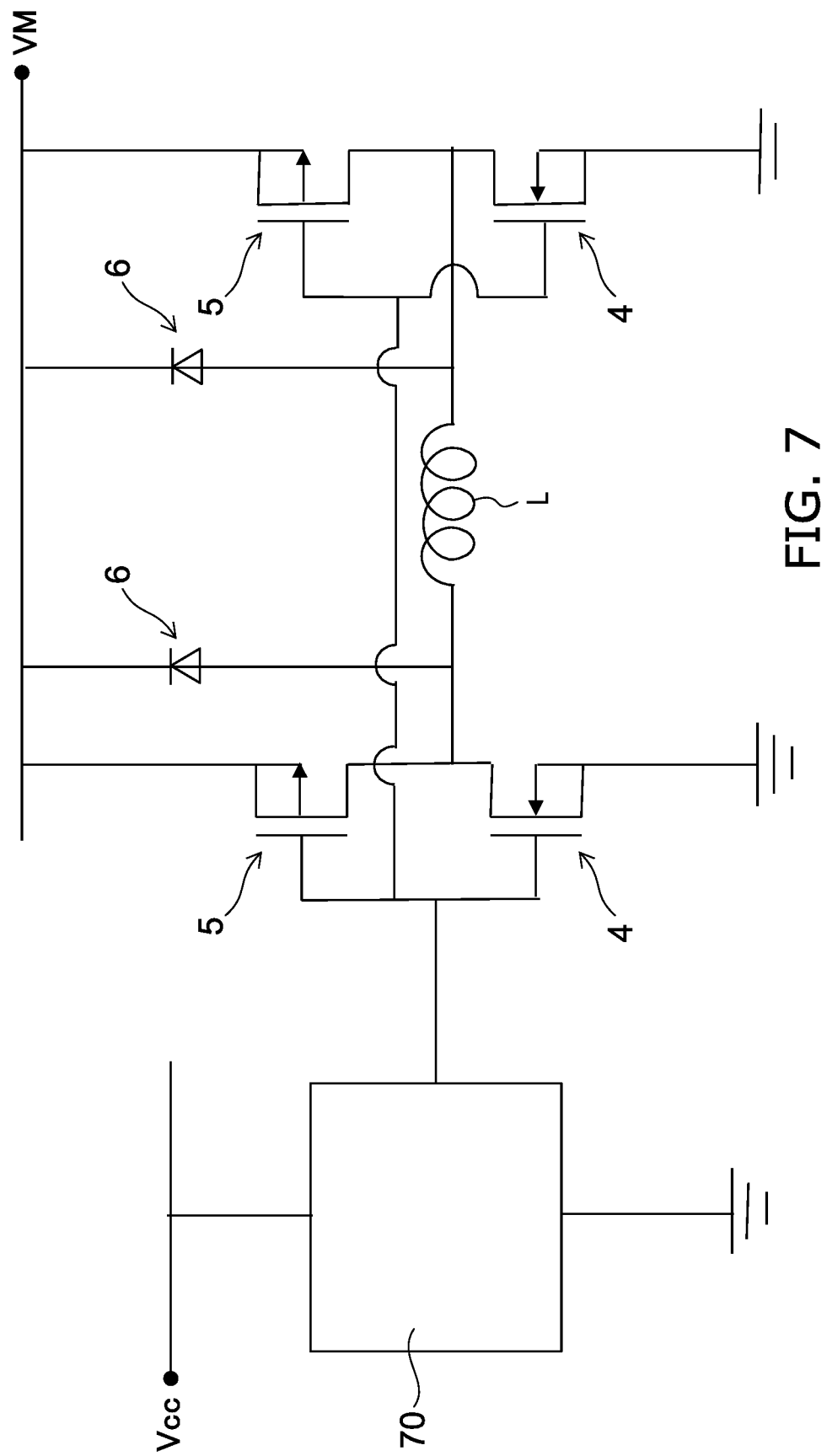
FIG. 7 is a circuit diagram of a semiconductor device of another embodiment.

The switching elements 4 and 5 and the diode 6 of the embodiment can be used for a motor control driver circuit shown in FIG. 7. FIG. 7 shows a motor control driver circuit of a bipolar drive system, in which two sets of the high-side switching element 5 and the low-side switching elements 4 are used in order to make driving by passing a current through the coil L in two directions.

A control signal of a control circuit 70 including the logic element 7 is outputted to the gates of the high-side switching element 5 and the low-side switching element 4. That is, the control circuit 70 controls the ON/OFF of the switching elements 5 and 4.

Figure 8:
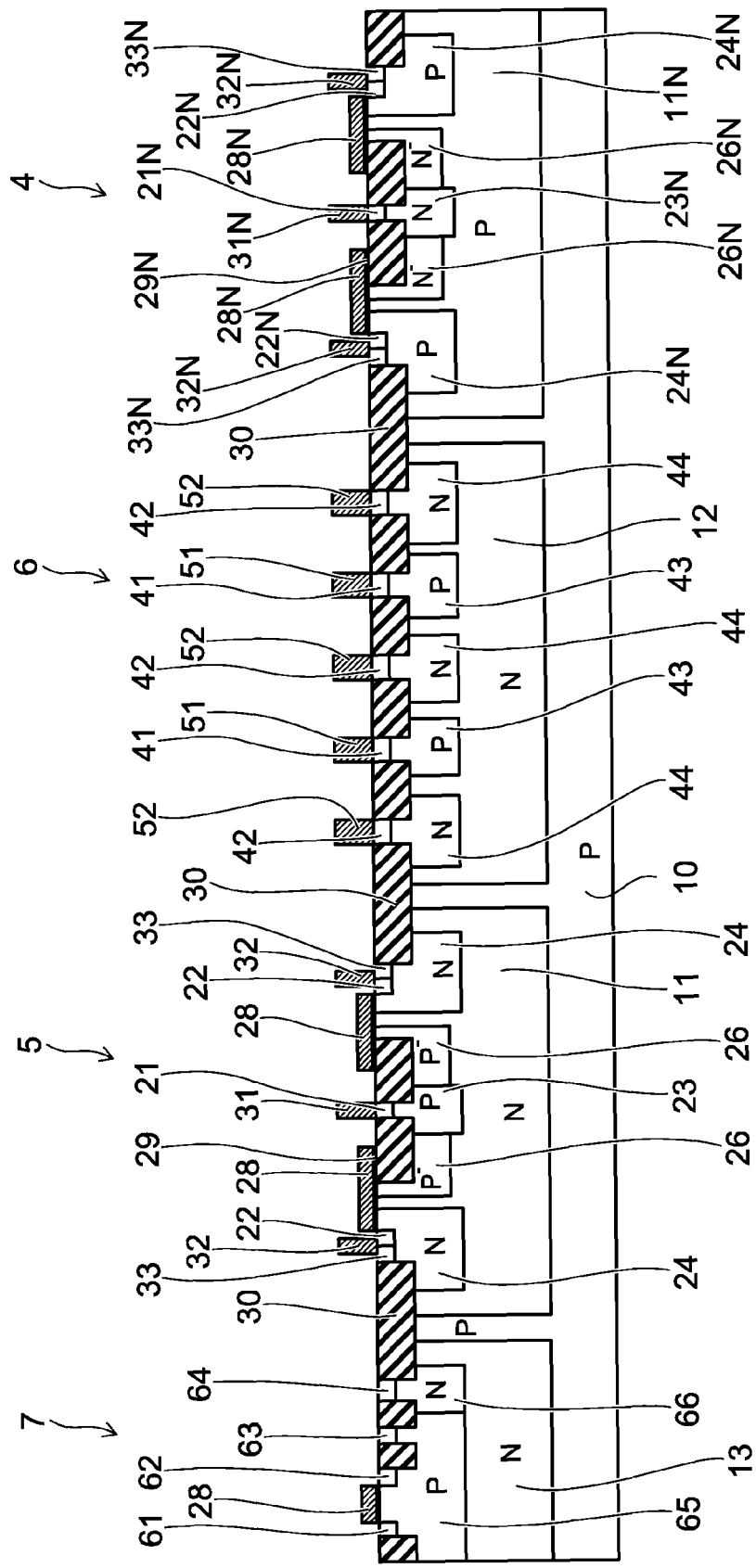
FIG. 8 is a schematic cross-sectional view of a semiconductor device of another embodiment.

As shown in FIG. 8, also the low-side switching element 4 is formed on the same substrate 10, along with the high-side switching element 5, the diode 6, and the logic element 7.

Figure 9A:
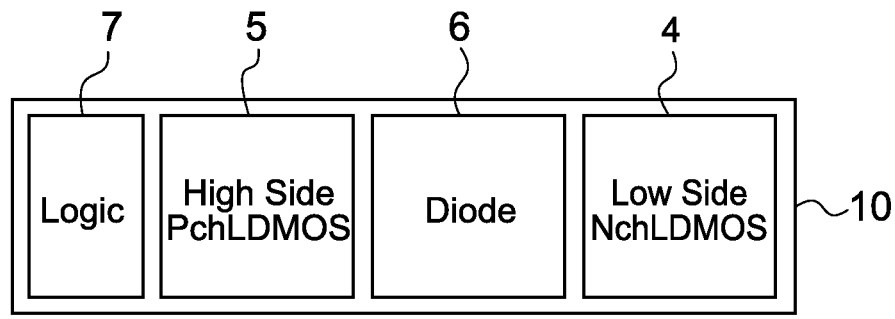
FIGS. 9A to 9C are schematic plan views of semiconductor devices of another embodiment.

FIG. 9A is a schematic plan view showing arrangement relationships among the logic element 7, the high-side switching element 5, the diode 6, and the low-side switching element 4 on the substrate 10.

The low-side switching element 4 is an N-channel DMOS, and has the same structure as the high-side switching element 5, which is a P-channel DMOS, except that the conductivity type of the corresponding component is opposite, for example. In the low-side switching element 4 shown in FIG. 8, the components corresponding to the components of the high-side switching element 5 described above are marked with reference numerals including "N".

By the embodiments described above, the regenerative current is more likely to flow to the diode 6 side than to the high-side switching element 5 side. Thus, in order to suppress the regenerative current flowing to the logic element 7 side, it is preferable that the position of the diode 6 and the position of the logic element 7 on the substrate 10 be apart.

In a motor control driver circuit and the like, the parasitic operation between the diode 6 and the high-side switching element 5 poses no problem because the high-side side is given the maximum voltage VM of the motor power supply voltage. However, since the power supply voltage Vcc of the logic element 7 is mostly lower than VM, the regenerative current may flow to the logic element 7 via the substrate 10, and the logic element 7 is likely to be broken due to latch-up.

In view of this, as shown in FIG. 8 and FIG. 9A, the high-side switching element 5 is disposed between the logic element 7 and the diode 6 on the substrate 10; thereby, the possibility that the regenerative current flowing to the diode 6 will flow to the logic element 7 via the substrate 10 is reduced.

Figure 9B:
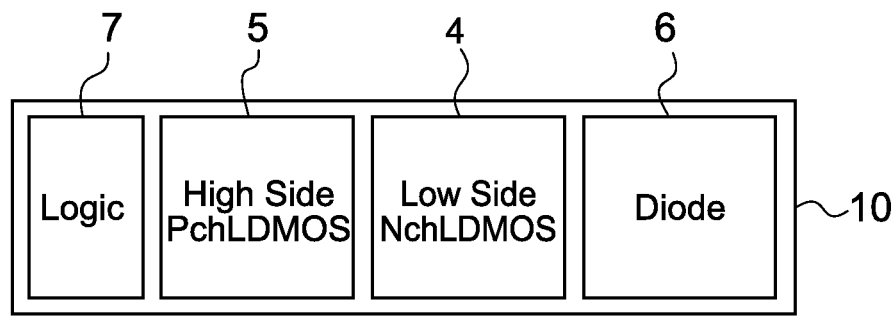

Alternatively, as shown in FIG. 9B, both the high-side switching element 5 and the low-side switching element 4 may be disposed between the logic element 7 and the diode 6.

Figure 9C:
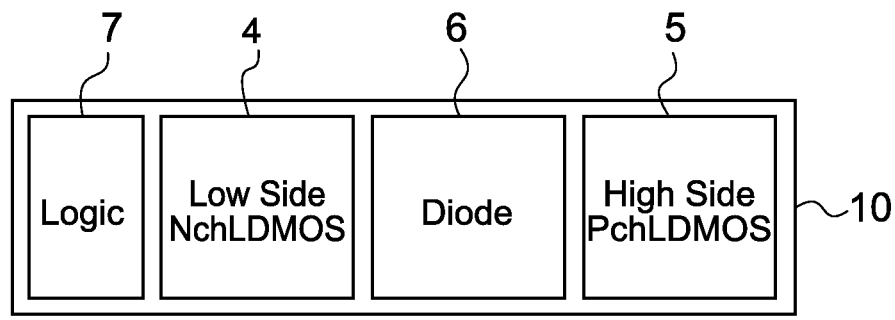

Alternatively, as shown in FIG. 9C, the low-side switching element 4 may be disposed between the logic element 7 and the diode 6.

For example, an N-type MOSFET may be used as the switching element. In this case, the first semiconductor layer is a P-type semiconductor. The P-type first semiconductor layer and the P-type semiconductor substrate can be electrically isolated by adding an N-type semiconductor layer surrounding the periphery of the first semiconductor layer, for example. Thus, the semiconductor substrate and the first semiconductor layer do not necessarily have different conductivity types. By providing a semiconductor layer electrically isolating the substrate and the first semiconductor layer, the effect of the invention of this application can be obtained even when the substrate and the first semiconductor layer are configured to have the same conductivity type.

Furthermore, also for the diode, even in the case of a diode in which the second semiconductor layer is the P-type, the P-type second semiconductor layer and the P-type semiconductor substrate can be electrically isolated by adding an N-type semiconductor layer surrounding the periphery of the second semiconductor layer, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising a switching element and a diode provided on a substrate,
   the switching element including:
   a first semiconductor layer provided in the substrate and electrically isolated from the substrate;
   a drain region provided on a surface of the first semiconductor layer;
   a source region provided apart from the drain region on the surface of the first semiconductor layer and having a same conductivity type as the drain region;
   a channel region provided between the drain region and the source region on the surface of the first semiconductor layer and having a conductivity type opposite to the conductivity type of the drain region and the source region;
   a gate insulating film provided on the channel region; and
   a gate electrode provided on the gate insulating film,
   the diode including:
   a second semiconductor layer provided in the substrate and electrically isolated from the substrate;
   an anode region provided on a surface of the second semiconductor layer; and
   a cathode region provided apart from the anode region on the surface of the second semiconductor layer,
   the source region and the cathode region being connected to a power source, and the drain region and the anode region being connected to an inductive load.

2. The semiconductor device according to claim 1, wherein
   the first semiconductor layer and the second semiconductor layer have a conductivity type opposite to a conductivity type of the substrate and
   the first semiconductor layer and the second semiconductor layer contact the substrate by p-n junction.

3. The semiconductor device according to claim 1, wherein a parasitic resistance of the diode is lower than a parasitic resistance of the switching element.

4. A semiconductor device comprising a switching element and a diode provided on a substrate,
   the switching element including:
   a first semiconductor layer provided in the substrate and electrically isolated from the substrate;
   a drain region provided on a surface of the first semiconductor layer;
   a source region provided apart from the drain region on the surface of the first semiconductor layer and having a same conductivity type as the drain region;
   a channel region provided between the drain region and the source region on the surface of the first semiconductor layer and having a conductivity type opposite to the conductivity type of the drain region and the source region;
   a gate insulating film provided on the channel region; and
   a gate electrode provided on the gate insulating film,
   the diode including:
   a second semiconductor layer provided in the substrate and electrically isolated from the substrate;
   an anode region provided on a surface of the second semiconductor layer; and
   a cathode region provided apart from the anode region on the surface of the second semiconductor layer,
   wherein an impurity concentration of the second semiconductor layer is higher than an impurity concentration of the first semiconductor layer.

5. The semiconductor device according to claim 1, wherein a distance between the anode region and the cathode region in the diode is shorter than a distance between the drain region and the source region in the switching element.

6. The semiconductor device according to claim 1, wherein an interconnection resistance of the diode is lower than an interconnection resistance of the switching element.

7. The semiconductor device according to claim 1, wherein
the first semiconductor layer and the second semiconductor layer have a same conductivity type and
the first semiconductor layer and the second semiconductor layer are separated by a region having an opposite conductivity type to the first semiconductor layer and the second semiconductor layer.

8. The semiconductor device according to claim 1, further comprising a buried layer provided between the substrate and the first semiconductor layer, and between the substrate and the second semiconductor layer, the buried layer having an opposite conductivity type to the substrate.

9. The semiconductor device according to claim 1, wherein the switching element has a DMOS (double diffused metal oxide semiconductor field effect transistor) structure.

10. The semiconductor device according to claim 1, further comprising a logic element provided on the substrate, the logic element having a different structure from the switching element and the diode.

11. The semiconductor device according to claim 10, wherein the switching element is provided between the logic element and the diode.

12. The semiconductor device according to claim 1, further comprising a logic element provide on the substrate, wherein the logic element controls the switching element, wherein the switching element is provided between the logic element and the diode.

13. A semiconductor device comprising a switching element and a diode provided on a substrate,
the switching element including:
a first semiconductor layer provided in the substrate and electrically isolated from the substrate;
a drain region provided on a surface of the first semiconductor layer;
a source region provided apart from the drain region on the surface of the first semiconductor layer and having a same conductivity type as the drain region;
a channel region provided between the drain region and the source region on the surface of the first semiconductor layer and having a conductivity type opposite to the conductivity type of the drain region and the source region;
a gate insulating film provided on the channel region; and
a gate electrode provided on the gate insulating film,
the diode including:
a second semiconductor layer provided in the substrate and electrically isolated from the substrate;
an anode region provided on a surface of the second semiconductor layer; and
a cathode region provided apart from the anode region on the surface of the second semiconductor layer,
wherein the switching element includes a P-channel DMOS (double diffused metal oxide semiconductor field effect transistor) and an N-channel DMOS connected in series to the P-channel DMOS.

14. The semiconductor device according to claim 13, wherein the diode is connected in parallel to the P-channel DMOS.

15. The semiconductor device according to claim 13, further comprising a logic element provided on the substrate, the logic element having a different structure from the P-channel DMOS, the N-channel DMOS, and the diode.

16. The semiconductor device according to claim 15, wherein at least one of the P-channel DMOS and the N-channel DMOS is provided between the logic element and the diode.

17. The semiconductor device according to claim 1,
wherein the first semiconductor layer and the second semiconductor layer are same layers.

18. The semiconductor device according to claim 1, further comprising
a first semiconductor region having a conductivity type opposite to the conductivity type of the first semiconductor layer and provided on the surface of the first semiconductor layer;
a second semiconductor region provided on the surface of the first semiconductor layer adjacent to the first semiconductor region, the second semiconductor region having the same conductivity type as the first semiconductor region, wherein an impurity concentration of the second semiconductor region is higher than that of the first semiconductor region; and
a third semiconductor region having the same conductivity type as the first semiconductor layer and provided on the surface of the first semiconductor layer;
wherein the drain region is formed on a surface of the second semiconductor region, and the source region is formed on a surface of the third semiconductor region.

19. The semiconductor device according to claim 1, further comprising
a pair of first semiconductor regions having a conductivity type opposite to the conductivity type of the first semiconductor layer and provided on the surface of the first semiconductor layer;
a second semiconductor region provided on the surface of the first semiconductor layer between the pair of first semiconductor regions, the second semiconductor region having the same conductivity type as the pair of first semiconductor regions, wherein an impurity concentration of the second semiconductor region is higher than that of the pair of first semiconductor regions; and
a pair of third semiconductor regions having the same conductivity type as the first semiconductor layer and provided on the surface of the first semiconductor layer apart from each of the pair of first semiconductor regions;
wherein the drain region is formed on a surface of the second semiconductor region, and the source region is formed on a surface of the pair of third semiconductor regions.

* * * * *